United States Patent
Brandl

(10) Patent No.: US 10,930,829 B2
(45) Date of Patent: Feb. 23, 2021

(54) METHOD OF PRODUCING SIDE-EMITTING COMPONENTS AND SIDE-EMITTING COMPONENT

(71) Applicant: OSRAM Opto Semiconductors GmbH, Regensburg (DE)

(72) Inventor: Martin Brandl, Kelheim (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 16/348,015

(22) PCT Filed: Feb. 28, 2018

(86) PCT No.: PCT/EP2018/054941
§ 371 (c)(1),
(2) Date: May 7, 2019

(87) PCT Pub. No.: WO2018/162301
PCT Pub. Date: Sep. 13, 2018

(65) Prior Publication Data
US 2020/0058836 A1  Feb. 20, 2020

(30) Foreign Application Priority Data
Mar. 7, 2017 (DE) .................. 10 2017 104 722.0

(51) Int. Cl.
*H01L 33/00* (2010.01)
*H01L 33/60* (2010.01)
*H01L 33/38* (2010.01)

(52) U.S. Cl.
CPC .......... *H01L 33/60* (2013.01); *H01L 33/382* (2013.01); *H01L 2933/0033* (2013.01); *H01L 2933/0058* (2013.01)

(58) Field of Classification Search
CPC .................. H01L 33/60; H01L 22/382; H01L 2933/0033; H01L 2933/0058
See application file for complete search history.

(56) References Cited

U.S. PATENT DOCUMENTS

2006/0049548 A1* 3/2006 Auburger ............ B29C 45/0055
264/400
2012/0302124 A1  11/2012 Imazu
(Continued)

FOREIGN PATENT DOCUMENTS

DE  10 2013 212 928 A1  1/2015
EP  2919283 A1  9/2015
(Continued)

*Primary Examiner* — Phuc T Dang
(74) *Attorney, Agent, or Firm* — DLA Piper LLP (US)

(57) ABSTRACT

A method of producing side-emitting components includes providing a plurality of semiconductor chips on an auxiliary carrier, wherein the semiconductor chips on the auxiliary carrier are spaced apart from each other and each have a side surface provided with a transparent protective layer; covering the semiconductor chips with a radiation-reflecting molding compound so that in a plan view of the auxiliary carrier, the semiconductor chips are completely covered by the molding compound; and singulating the molding compound and the semiconductor chips into a plurality of components so that the components each include a semiconductor chip, wherein the components are singulated at the associated transparent protective layer, as a result of which the components each have a radiation exit surface exposed by the molding compound and formed by a surface of the remaining or exposed transparent protective layer.

19 Claims, 4 Drawing Sheets

(56) References Cited

U.S. PATENT DOCUMENTS

| | | |
|---|---|---|
| 2015/0034987 A1 | 2/2015 | Hayashi |
| 2016/0155891 A1* | 6/2016 | Moosburger .......... H01L 33/502 |
| | | 257/98 |
| 2016/0163932 A1 | 6/2016 | Brandl |
| 2016/0308102 A1* | 10/2016 | Zitzlsperger .......... H01L 33/486 |
| 2017/0033026 A1* | 2/2017 | Ho ...................... H01L 23/5389 |
| 2018/0182943 A1 | 6/2018 | von Malm |

FOREIGN PATENT DOCUMENTS

| | | |
|---|---|---|
| JP | 2012-253223 A | 12/2012 |
| WO | 2016/202794 A1 | 12/2016 |

\* cited by examiner

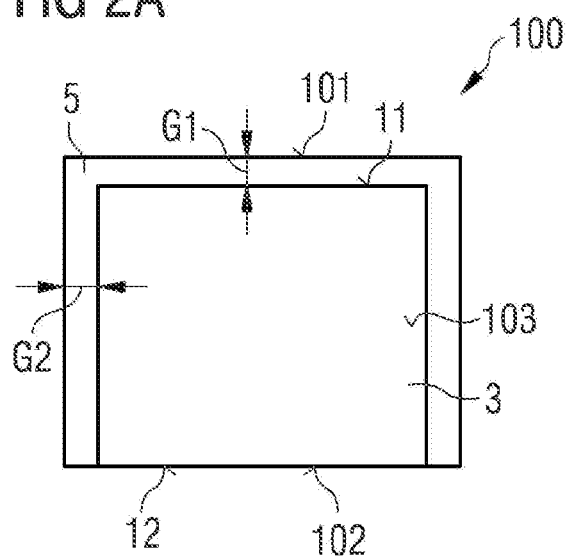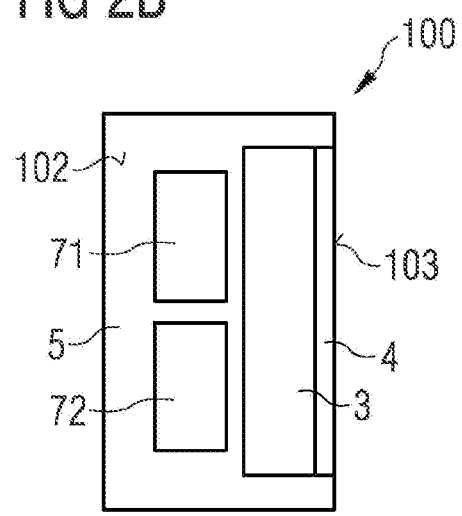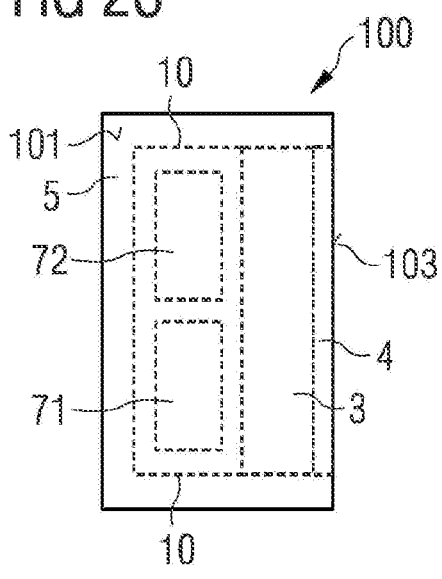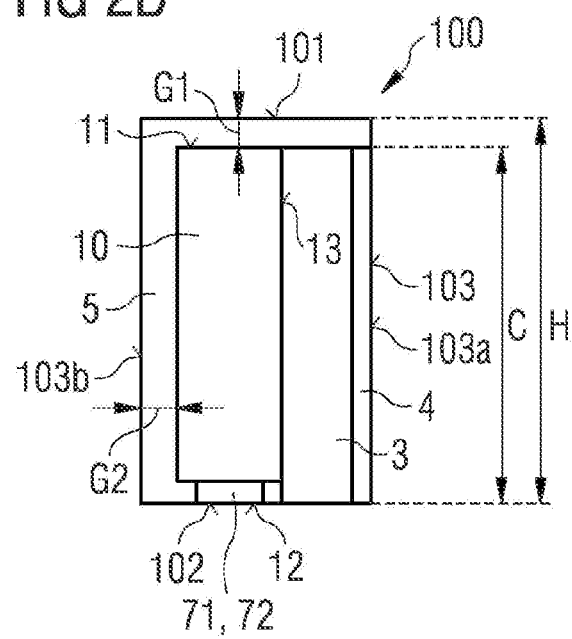

METHOD OF PRODUCING SIDE-EMITTING COMPONENTS AND SIDE-EMITTING COMPONENT

TECHNICAL FIELD

This disclosure relates to a method of producing side-emitting components and a side-emitting component.

BACKGROUND

LED side-emitters are often used in products having LED backlighting such as mobile phones or tablets, wherein, in particular emitted white light is first laterally coupled into a diffusing lens before the desired colors of individual pixels are filtered out from the white light using, for example, color filters and/or a liquid crystal layer. It is often desirable that such products have a particularly thin display. The lowest possible overall height of the LED side-emitter is therefore one of the key factors for the realization of a thin display.

Conventional side-emitters usually have a housing comprising a lead frame encapsulated by a molding material such that a cavity is formed in which a semiconductor chip is arranged on the lead frame. The cavity may have radiation-reflecting side walls. Since, on the one hand, a distance between the semiconductor chip and the side walls of the cavity must be maintained and on the other hand, the side walls cannot be realized as thin as desired, the current overall heights of the conventional side-emitters amount to approximately 300 µm to 400 µm if the side-emitters have a semiconductor chip with an overall height of approximately 120 µm.

It could therefore be helpful to provide a method by which side-emitting components are produced in a simplified and efficient way and to provide a side-emitting component having a particularly low overall height.

SUMMARY

I provide a method of producing side-emitting components including providing a plurality of semiconductor chips on an auxiliary carrier, wherein the semiconductor chips on the auxiliary carrier are spaced apart from each other and each have a side surface provided with a transparent protective layer; covering the semiconductor chips with a radiation-reflecting molding compound so that in a plan view of the auxiliary carrier, the semiconductor chips are completely covered by the molding compound; and singulating the molding compound and the semiconductor chips into a plurality of components so that the components each include a semiconductor chip, wherein the components are singulated at the associated transparent protective layer, as a result of which the components each have a radiation exit surface exposed by the molding compound and formed by a surface of the remaining or exposed transparent protective layer.

I also provide a side-emitting component producible according to the method of including providing a plurality of semiconductor chips on an auxiliary carrier, wherein the semiconductor chips on the auxiliary carrier are spaced apart from each other and each have a side surface provided with a transparent protective layer; covering the semiconductor chips with a radiation-reflecting molding compound so that in a plan view of the auxiliary carrier, the semiconductor chips are completely covered by the molding compound; and singulating the molding compound and the semiconductor chips into a plurality of components so that the components each include a semiconductor chip, wherein the components are singulated at the associated transparent protective layer, as a result of which the components each have a radiation exit surface exposed by the molding compound and formed by a surface of the remaining or exposed transparent protective layer, including a semiconductor chip and a radiation-reflecting housing, wherein the semiconductor chip is completely covered by the radiation-reflecting housing except for a side surface and a rear side, the side surface is covered by a transparent protective layer, the surface of which forms a radiation exit surface of the component and shows singulating traces, the component is electrically externally connectable via the rear side of the semiconductor chip, and during operation of the component, electromagnetic radiation generated by the semiconductor chip can be decoupled from the component exclusively via the radiation exit surface.

I further provide an arrangement including the side-emitting component according to a method of producing side-emitting components including providing a plurality of semiconductor chips on an auxiliary carrier, wherein the semiconductor chips on the auxiliary carrier are spaced apart from each other and each have a side surface provided with a transparent protective layer; covering the semiconductor chips with a radiation-reflecting molding compound so that in a plan view of the auxiliary carrier, the semiconductor chips are completely covered by the molding compound; and singulating the molding compound and the semiconductor chips into a plurality of components so that the components each include a semiconductor chip, wherein the components are singulated at the associated transparent protective layer, as a result of which the components each have a radiation exit surface exposed by the molding compound and formed by a surface of the remaining or exposed transparent protective layer, further including a converter layer between the side surface and the transparent protective layer, wherein the converter layer completely covers the side surface, arranged on a printed circuit board, wherein the component is electrically connectable to the printed circuit board via the rear side of the semiconductor chip, and the converter layer thermally connects to the printed circuit board directly or exclusively via a single connecting layer.

I still further provide a side-emitting component including a semiconductor chip and a radiation-reflecting housing, wherein the semiconductor chip is completely covered by the radiation-reflecting housing except for a side surface and a rear side, the side surface is covered by a transparent protective layer, the surface of which forms a radiation exit surface of the component and shows singulating traces, the component is electrically externally connectable via the rear side of the semiconductor chip, the component or the radiation-reflecting housing has a total vertical height that differs by at most 50% from a vertical height of the associated semiconductor chip, and during operation of the component, electromagnetic radiation generated by the semiconductor chip can be decoupled from the component exclusively via the radiation exit surface.

I still further provide a side-emitting component including a semiconductor chip and a radiation-reflecting housing, wherein the semiconductor chip is covered by the radiation-reflecting housing except for a side surface, wherein a rear side of the semiconductor chip is covered at least in places by a material of the housing, the side surface is covered by a transparent protective layer, the surface of which forms a radiation exit surface of the component and shows singulating traces, the component is electrically externally connectable via the rear side of the semiconductor chip, the component or the radiation-reflecting housing has a total vertical height that differs by at most 50% from a vertical height of the associated semiconductor chip, and during operation of the component, electromagnetic radiation generated by the semiconductor chip can be decoupled from the component exclusively via the radiation exit surface.

BRIEF DESCRIPTION OF THE DRAWINGS

FIGS. 2A, 2B, 2C and 2D show schematic representations of a side-emitting component in different views.

LIST OF REFERENCE SIGNS

Figure 1A:
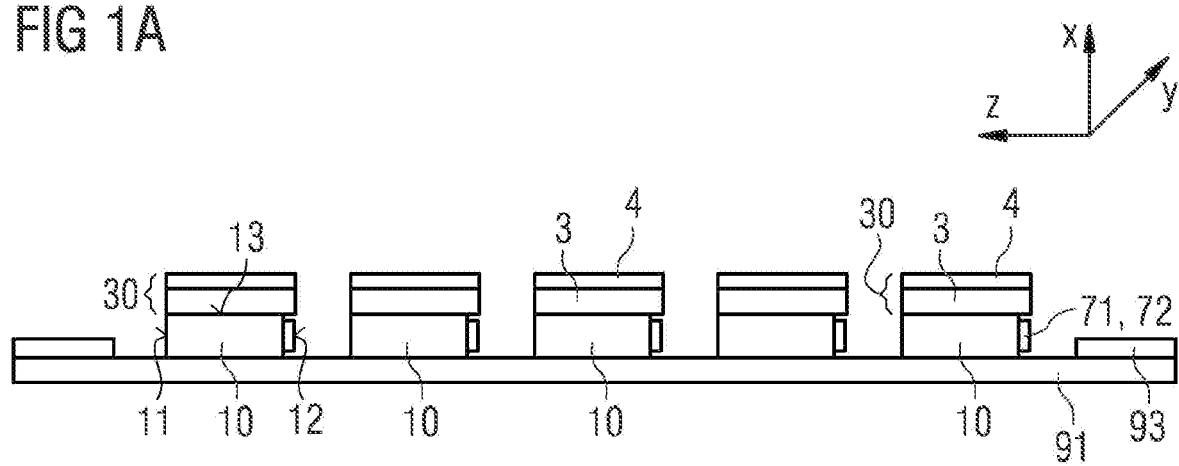
FIGS. 1A, 1B, 1C and 1D show different method steps of an example for production of a side-emitting component in schematic sectional views.

100 Component
101 Front side of the component
102 Rear side of the component
103 Radiation exit surface of the component
103a Front side surface of the component
103b Rear side surface of the component
10 Semiconductor chip
11 Front side of the semiconductor chip
12 Rear side of the semiconductor chip
13 Side surface of the semiconductor chip
2 Semiconductor body of the semiconductor chip
21 First semiconductor layer of the semiconductor body
22 Second semiconductor layer of the semiconductor body
23 Active layer of the semiconductor body
3 Converter layer
30 Conversion platelet
4 Transparent protective layer
5 Housing of the component
50 Molding compound
51 Matrix material
52 Radiation-reflecting particles
53 Fillers
6 Mirror layer
70 Insulating layer
71 First terminal pad
72 Second terminal pad
8 Circuit board
80 Basic body of the printed circuit board
81 conductor track,
  electrical and/or thermal connection surface
9 Substrate of the semiconductor chip
90 Auxiliary carrier
91 Carrier layer
92 Connecting layer
93 Frame
H Vertical height of the component
C Vertical height of the semiconductor chip
G1 Vertical layer thickness of housing
G2 Lateral layer thickness of the housing
Lateral layer thickness of the transparent protective layer
T Separating line

DETAILED DESCRIPTION

My method of producing side-emitting components may include providing a plurality of semiconductor chips on an auxiliary carrier, wherein the semiconductor chips on the auxiliary carrier are spatially spaced from each other. The semiconductor chips may each have a side surface provided with a transparent protective layer. The semiconductor chips may be covered with a molding compound that is especially radiation-reflecting so that in a plan view of the auxiliary carrier, the semiconductor chips are completely covered by the molding compound. In a subsequent method step, the molding compound and the semiconductor chips are singulated into a plurality of components so that each component has a semiconductor chip. The components can each have a housing as part of the molding compound. The components are singulated preferably at the corresponding transparent protective layer, as a result of which the components each have a radiation exit surface exposed by the molding compound and formed by a surface of the remaining or exposed transparent protective layer.

The above-mentioned method makes it possible to produce a side-emitting component as a CSP-component (Chip Scale Package) whose total vertical height or the total vertical height of the housing differs only slightly from the vertical height of the associated semiconductor chip, for instance by at most 50%, 30%, 20% or 10%. The side surface covered with the transparent protective layer is in particular a vertical side surface. Using a conventional semiconductor chip having an overall height of for instance 120 µm, a side-emitting component having a maximum vertical height of 180 µm or 150 µm can be produced. This means that the current overall height of conventional side-emitters can be reduced by up to 50% or up to 65%. The use of such side-emitting CSP components makes it possible to realize particularly thin displays.

In a side-emitting component, a radiation exit surface of the component is directed transversely or perpendicularly in particular to a mounting surface or to a contact surface of the component. The mounting surface or the contact surface is in particular a surface of the component preferably having electrical terminal pads to electrically contact the component.

A vertical direction means a direction directed transversely or perpendicularly to a main extension surface of the semiconductor chip or the component, for instance transversely or perpendicularly to the mounting surface or the contact surface of the component. For example, the vertical direction is parallel to a growth direction of the semiconductor layers of the semiconductor chip. A lateral direction means a direction that runs along, in particular parallel to the main extension surface of the semiconductor chip or the component, for instance parallel to the mounting surface or the contact surface of the component. The vertical direction and the lateral direction are thus transverse or essentially perpendicular to each other. The vertical side surface of the semiconductor chip is a surface of the semiconductor chip that spatially delimits the semiconductor chip in a lateral direction and extends along the vertical direction.

The molding compound may be singulated such that the components each have a radiation-reflecting housing made of the molding compound, wherein the housing laterally surrounds the associated semiconductor chip except for the side surface provided with the remaining transparent protective layer. In particular, the semiconductor chip directly adjoins the housing so that preferably no gaps are formed between the semiconductor chip and the housing.

The component thus has a radiation-reflecting housing serving as a reflector and covers, in particular completely covers all side surfaces of the semiconductor chip except the side surface having the transparent protective layer so that, during operation of the component, the light emitted by the semiconductor chip is coupled out exclusively via the side surface having the transparent protective layer, namely via the lateral radiation exit surface of the component.

In a plan view, the housing can completely cover the semiconductor chip, especially a front side of the semiconductor chip. A rear side of the semiconductor chip, via which the semiconductor chip can electrically externally connects, may be partially covered by the housing. Along the vertical direction, the housing may project at least 20 µm or at least 30 µm, but preferably at most 40 µm, 50 µm, 60 µm or at most 80 µm beyond the semiconductor chip, e.g. beyond the front side of the semiconductor chip. In the lateral directions, the housing may have a layer thickness of at least 20 µm, 30 µm, 50 µm or at least 60 µm. This allows a particularly high reflectance of the housing to be achieved, for example, of at least 65%, 75%, 85%, 90% or at least 95%. If the semiconductor chip is a blue light emitting semiconductor chip, a housing having such layer thicknesses can prevent blue or ultraviolet radiation from accidentally passing through the housing and escaping into the vicinity of the component.

The semiconductor chips may be volume-emitting semiconductor chips that, after singulation, are completely covered by the housing except for a rear side and the side surface covered by the transparent protective layer. For example, the volume-emitting semiconductor chips have a substrate on which a semiconductor body is arranged or epitaxially grown, where the substrate can be radiation-transmissive. The substrate may be a growth substrate such as a sapphire substrate, or different from a growth substrate. In particular, a surface of the substrate forms the front side of the semiconductor chip. A rear side of the semiconductor chip that, for example, forms a mounting surface or a contact surface of the semiconductor chip or of the component, can be a surface of the semiconductor chip or of the semiconductor body that faces away from the substrate.

The semiconductor chips may each electrically externally connect via their rear side. The rear sides of the semiconductor chips may be adjacent in particular to the corresponding vertical side surfaces and run for instance transversely or perpendicularly to the radiation exit surface of the associated component. A rear side of the component can be formed at least partially by the rear side of the semiconductor chip, wherein the rear side of the component is formed in particular as a mounting surface or as a contact surface of the component. The rear side of the semiconductor chip may be partially covered by a material of the molding compound or of the housing.

After singulation, the components may be separated from the auxiliary carrier. The surfaces of the components adjacent to the auxiliary carriers are thus exposed and form, for example, the rear sides of the respective components. The auxiliary carrier thus serves in particular as a temporary carrier layer or carrier film.

The semiconductor chips may be covered by a mold process, wherein prior to singulation, the semiconductor chips are completely enclosed by the molding compound in lateral directions. In particular, all gaps between the laterally spaced semiconductor chips are filled, for instance completely filled. In a plan view, all front sides of the semiconductor chips can be covered, especially completely covered by the molding compound. It is possible that possible gaps between the semiconductor chips and the auxiliary carrier are also filled by the molding compound so that the rear sides of the semiconductor chips can be partially covered by the molding compound. In particular after the covering of the semiconductor chips, the molding compound is formed in one piece. All semiconductor chips are enclosed by the molding compound in all lateral directions and especially in at least one vertical direction.

A mold process is generally understood to be a process during which a casting material is shaped into a molding compound preferably under the influence of pressure and, if necessary, cured. In particular, the term "mold process" includes molding, film assisted molding, injection molding, transfer molding and compression molding. For example, the molding compound is applied to the semiconductor chips and the auxiliary carrier by film assisted molding.

The molding compound may comprise a matrix material, radiation-reflecting particles to achieve high reflectivity and fillers to reduce the coefficient of thermal expansion, wherein the radiation-reflecting particles and the fillers are embedded in the matrix material.

The matrix material can be made of silicone or epoxy. The radiation-reflecting particles can be metal particles or metal oxide particles such as $TiO_2$-particles. The fillers may contain $SiO_2$-particles. In particular, at least 50% by weight, 70% by weight or at least 80% by weight or at least 95% by weight of the molding compound may consist of the radiation-reflecting particles and/or of the fillers. Preferably, the fillers are $SiO_2$-particles and the radiation-reflecting particles $TiO_2$-particles, wherein the fillers and the radiation-reflecting particles account for 70% to 95% by weight of the molding compound.

Before being provided on the auxiliary carrier, the semiconductor chips are arranged on a carrier layer and each provided with an at least two-layer conversion platelet on the respective side surfaces. The carrier layer can be an adhesive layer or a self-supporting adhesive film. In particular, the semiconductor chips are arranged on the carrier layer such that one side surface of the semiconductor chip faces the carrier layer and another side surface, to be provided with a transparent protective layer, is opposite from the carrier layer and exposed.

The two-layer conversion platelet has in particular a converter layer and a transparent protective layer. In particular, the conversion platelet is prefabricated and glued onto the side surface facing away from the carrier layer. Compared to a molding compound containing phosphors and applied directly onto the semiconductor chip, for example, by a coating process, a prefabricated conversion platelet has a uniform layer thickness and enables precise control regarding color location.

Singulation of the components takes place particularly at the corresponding transparent protective layers so that no material of the converter layer or the converter layers is removed, as a result of which no color location fluctuation is generated due to the singulation process. Improved control regarding color location can also be achieved by individual electro-optical characterization of the separately produced conversion platelet. For example, desired color boxes can be realized by combining suitable semiconductor chips with suitable conversion platelets. The cutting surface created during singulation that in particular defines the radiation exit surface of the component can run along the vertical direction through the middle of the associated transparent protective layer or at least cut into areas of the associated transparent protective layer. In particular, the transparent protective layer completely covers the corresponding converter layer even after singulation.

The transparent protective layer may have a lateral layer thickness formed so thick that the transparent protective layer can be singulated along its entire extent when the components are singulated. After singulation, the transparent protective layer can be singulated into two partial layers, each with original expansion and reduced lateral layer thickness. A first partial layer can be assigned to a first component and a second partial layer to a second component, wherein the first component and the second component are adjacent components on the auxiliary carrier. It is possible that the finished component has a front side transparent protective layer at the radiation exit surface and a further transparent protective layer on a further, in particular, rear side surface, wherein the front side transparent protective layer and/or the further transparent protective layer have singulating traces. The component may have several, for instance two or three, additional side surfaces which are free of a transparent protective layer.

My side-emitting component may comprise a semiconductor chip and a radiation-reflecting housing. The semiconductor chip may be completely covered by the radiation-reflecting housing except for a side surface, for example, for a vertical side surface, and except for a rear side, for example, for a surface of the semiconductor chip extending in lateral directions. The side surface not covered by the housing may be covered, in particular completely covered by a transparent protective layer, wherein one surface of the transparent protective layer forms a radiation exit surface of the component. In particular, the radiation exit surface may show traces of singulation. For example, the component can be electrically externally connected via the rear side of the semiconductor chip, wherein, during operation of the component, the electromagnetic radiation generated by the semiconductor chip can be decoupled from the component preferably only via the side surface formed as the radiation exit surface.

In particular, such a side-emitting component can be produced using my method. The features described in connection with the side-emitting component can therefore also be used for the method and vice versa.

The component may have a vertical height of at most 200 µm, for instance 180 µm, preferably 150 µm or at most 130 µm. The total height of the component is composed exclusively of the vertical height of the semiconductor chip and the vertical layer thickness of the housing over the front side of the semiconductor chip. In the vertical direction, the housing preferably protrudes at most 20 µm, 30 µm, 40 µm, 50 µm or at most 60 µm beyond the semiconductor chip.

The semiconductor chip may have a mirror layer on its rear side. The mirror layer can be metallic, for example, made of silver, or dielectric, for example, in the form of a Bragg mirror. In particular, the mirror layer is an integrated part of the semiconductor chip, for example, in the form of a combo mirror or of a radiation-reflecting current expansion layer. Together with the mirror layer and the radiation-reflecting housing, the component is covered, in particular completely covered on all sides by radiation-reflecting layers except for the radiation exit surface so that, during operation of the component, the electromagnetic radiation generated by the semiconductor chip can be decoupled exclusively via the laterally arranged radiation exit surface. Since hardly any portion of radiation is lost due to possible absorption, the component can be formed in a particularly efficient manner.

A converter layer may be arranged between the side surface of the semiconductor chip and the transparent protective layer, wherein the converter layer completely covers the side surface of the semiconductor chip. In particular, the converter layer is completely covered by the transparent protective layer. The converter layer may contain phosphors configured to convert short-wave, ultraviolet or blue ranges of radiation into long-wave, yellow, green or red ranges of radiation.

My arrangement may comprise an in particular side-emitting component arranged on a printed circuit board. The component can electrically connect to the printed circuit board via the rear side of the semiconductor chip, for example. Preferably, the converter layer thermally connects to the printed circuit board directly or exclusively via a single connecting layer so that thermal dissipation of the converter layer can take place directly via the printed circuit board. The printed circuit board can have electrical and thermal connection surfaces via which the semiconductor chip or component can electrically and thermally connect to the printed circuit board. Since the converter layer is usually electrically insulating, it is possible that the printed circuit board has a common connection surface set up for both the electrical connection and the thermal connection with the component.

Further advantages, preferred configurations and further developments of the method or the component will become apparent from the examples explained below in conjunction with the drawings.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

In FIGS. 1A to 1D, a plurality of semiconductor chips 10 on a carrier layer 91 are shown schematically in an xz plane, where z indicates a vertical direction and x indicates a lateral direction. The vertical direction z can be parallel or perpendicular to a growth direction of the semiconductor layers of the respective semiconductor chip 10. The coordinate y in FIGS. 1A to 1D indicates a further lateral direction.

According to FIG. 1A, the semiconductor chips 10 on the carrier layer 9 are spatially spaced from each other and enclosed by a frame 93 for instance made of plastic. For example, the carrier layer 91 is an adhesive film, for instance a self-supporting adhesive film or a thermally separable carrier film. The semiconductor chips 10 are each applied to the carrier layer 91 such that a rear side 12 of the semiconductor chip 10, which in particular has electrical terminal pads 71 and 72 and forms for instance a mounting surface or a contact surface of the semiconductor chip 10, runs transversely or perpendicularly to a main extension surface of the carrier layer 91. The electrical terminal pads 71 and 72 can be formed in the form of solder pads. The semiconductor chips 10 each have a front side 11 also running transversely or perpendicular to the main extension surface of the carrier layer 91 and facing away from the rear side 12. The front side 11 can be formed by a surface of a substrate of the semiconductor chip 10, for instance of a growth substrate.

The semiconductor chips 10 each have a side surface 13 facing away from the carrier layer 91 and is for instance parallel to the main extension surface of the carrier layer 91. The side surface 13 may be exposed before a conversion platelet 30, in particular a prefabricated conversion platelet 30, is applied onto the exposed side surface 13. In a plan view, the conversion platelet 30 covers the side surface 13 in particular completely. The semiconductor chips 10 each have further side surfaces that are for instance perpendicular to the main extension surface of the carrier layer 91 and in particular have smaller surfaces than the side surface 13 covered by the conversion platelet 30.

The conversion platelet 30 has a converter layer 3 and a transparent protective layer 4, wherein the converter layer 3 is arranged between the protective layer 4 and the side surface 13. Preferably, the transparent protective layer 4 completely covers the converter layer 3. The converter layer 3 and/or the protective layer 4 can have a matrix material made of silicone, glass or ceramic. The converter layer 3 contains phosphors embedded in the matrix material, for example, and especially configured to convert short-wave, ultraviolet or blue ranges of the electromagnetic radiation generated during operation of the semiconductor chip 10 into long-wave, yellow, green or red ranges of radiation. In particular, only one single side surface 13 of the semiconductor chip 10 is covered with the transparent protective layer 4 or the conversion platelet 30. This side surface 13 having the conversion platelet 30 serves in particular as radiation passage or radiation exit surface of the component to be produced.

Figure 1B:
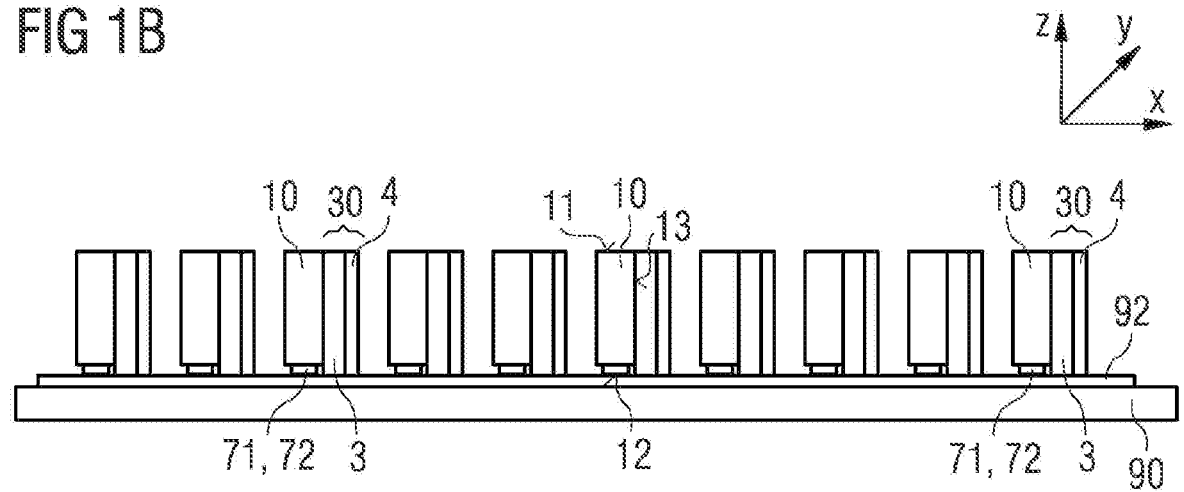

The semiconductor chips 10 having the conversion platelets 30 arranged thereon can be detached from the carrier layer 91 and applied onto an auxiliary carrier 90 such that the rear sides 12 of the semiconductor chips 10 face the auxiliary carrier 90 (FIG. 1B). In particular, the semiconductor chips 10 are attached to the auxiliary carrier 90 by a connecting layer 92, for instance an adhesive layer.

Figure 1C:
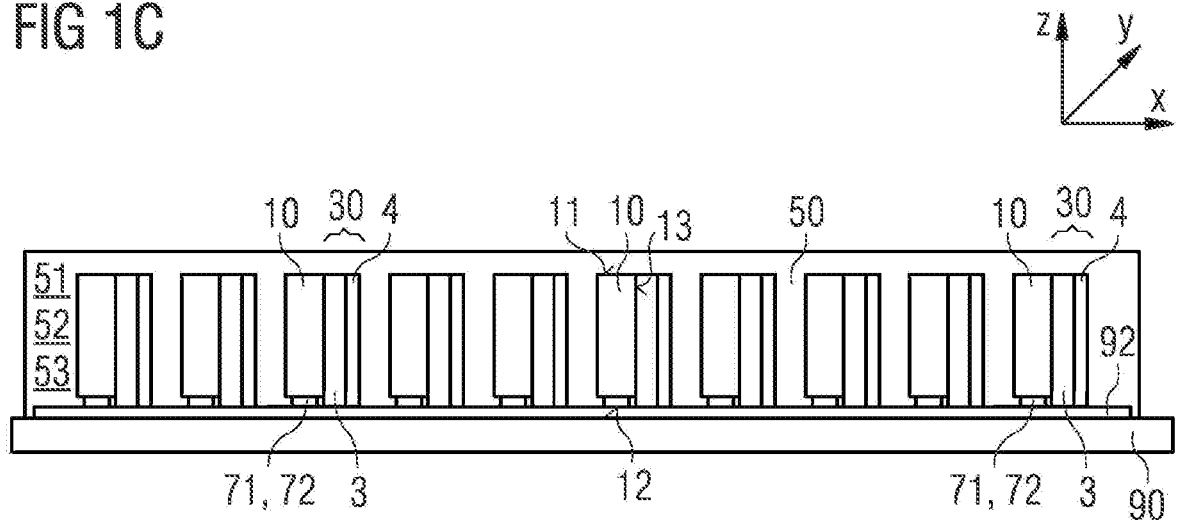

According to FIG. 1C, the semiconductor chips 10 are preferably covered by a molding compound 50 by a mold process. In top view of the auxiliary carrier 90, the molding compound 50 completely covers the semiconductor chips 10. In lateral directions, the semiconductor chips 10 are completely enclosed by the molding compound. Gaps possibly formed between the auxiliary carrier 90 and the semiconductor chips 10 can also be filled by the molding compound 50. The rear sides 12 of the semiconductor chips 10 can thus be partially covered by the molding compound 50.

The molding compound 50 is preferably configured to reflect radiation. For example, the molding compound 50 has a matrix material 51 and radiation-reflecting particles 52 such as metal particles or metal oxide particles such as $TiO_2$ embedded in the matrix material 51. In addition, to reduce the coefficient of thermal expansion, the molding compound 50 can contain 53 fillers such as $SiO_2$ that can also be embedded in the matrix material 51. To achieve a high degree of reflection and sufficiently reduce or adjust the thermal expansion coefficient of the molding compound 50, 50% to 95% by weight of the molding compound 50 can be accounted for by the fillers 53 and/or by the radiation-reflecting particles 52.

Figure 1D:
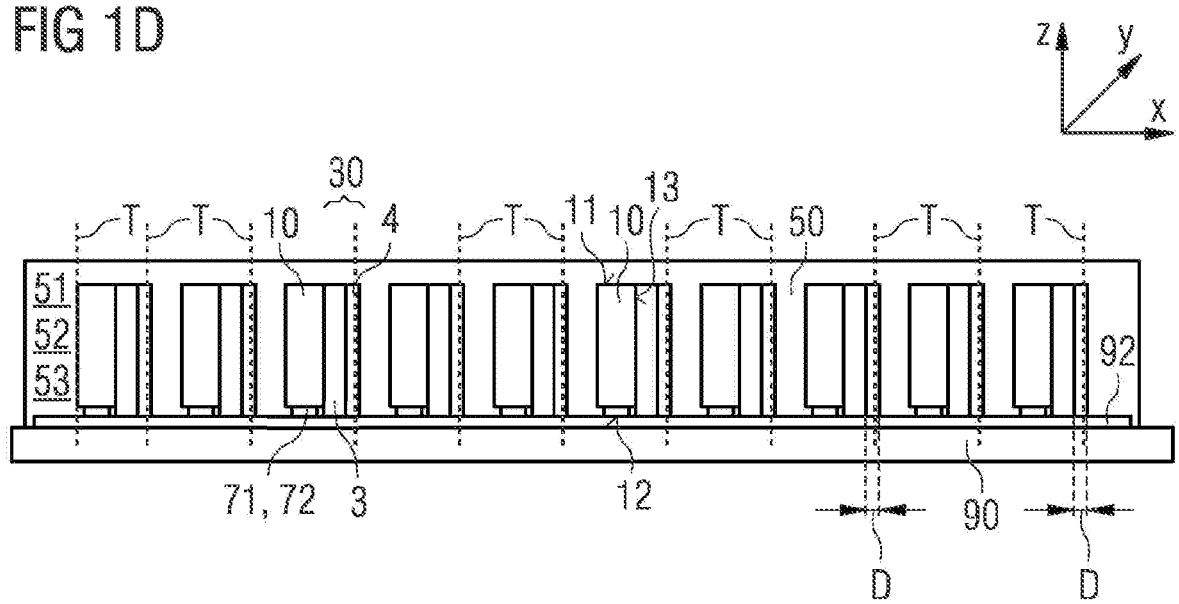

According to FIG. 1D, the molding compound 50 and the semiconductor chips 10 embedded therein are singulated along separating lines T into a plurality of components 100. The singulation process can be carried out by a mechanical process such as sawing or by laser cutting.

The individual components each have, for example, a semiconductor chip 10 and a housing 5 as part of the molding compound 50. Preferably, each of the components 100 is singulated at the corresponding transparent protective layer 4, for example, in the immediate vicinity of the corresponding transparent protective layer 4 or through the middle of the corresponding transparent protective layer 4. It is possible that the transparent protective layer 4 is only cut in areas and not cut throughout in the middle. In the region of the respective semiconductor chip 10, the associated separating line T can run at least partially or completely within the transparent protective layer 4. After or right after singulation, the components 100 each have a radiation exit surface 103 which, in particular, formed by a surface of the remaining or exposed transparent protective layer 4 and exposed from the molding compound 50 or from the housing 5. The radiation exit surface 103 may show singulation traces characteristic of the applied singulation process. Such a component 100 is schematically represented for instance in FIGS. 2A to 2D in different views.

The semiconductor chips 10 having the conversion platelets 30 can be arranged in rows and columns on the auxiliary carrier 90 such that the semiconductor chips 10 are spaced apart and the spatial distances between adjacent semiconductor chips 10 are maintained such that the housings 5 of the components 100 are formed immediately after the singulation step—in particular without a further processing step—as parts of the molding compound 50.

FIG. 2A shows the component 100 in a plan view of the radiation exit surface 103, e.g. in top view on a surface of the transparent protective layer 4. The converter layer 3 completely covers the side surface 13 of the semiconductor chip 10 and is laterally delimited by the housing 5.

On the front side 11 of the semiconductor chip 10 or on a front side 101 of the component 100, the housing 5 has a vertical layer thickness G1 of, for example, 20 μm to 80 μm, for instance 30 μm to 60 μm. On the rear side 12 of the semiconductor chip 10 or on a rear side 102 of the component 100, the converter layer 3 can be free of a material of the housing 5. The side surface 13 of the semiconductor chip 10 covered by the converter layer 3 or the transparent protective layer 4 is free of the material of the housing 5. For instance, on three further side surfaces of the semiconductor chip 10, the housing 5 has a lateral layer thickness G2 of, for example, at least 20 μm, 30 μm, 50 μm or at least 60 μm. The lateral layer thickness G2 can be at most 50 μm, 60 μm, 100 μm or at most 200 μm. If the semiconductor chip 10 is a volume-emitter emitting blue light, the housing 5 having such layer thicknesses can prevent blue or ultraviolet radiation from passing through the housing 5.

FIG. 2B shows the component 100 in a plan view of the rear side 102. The rear side 102 of component 100 or the rear side 12 of the semiconductor chip has a first terminal pad 71 and a second terminal pad 72, wherein the component 100 can be externally electrically contacted via the terminal pads 71 and 72. In particular, the terminal pads 71 and 72 are assigned to different electrical polarities of the component 100. As shown in FIG. 2B, the converter layer 3 and the transparent protective layer 4 can extend along the vertical direction for instance from the front side 11 of the semiconductor chip 10 to the rear side 12 or 102.

FIG. 2C shows the component 100 in a plan view of its front side 101, wherein the semiconductor chip 10 having the terminal pads 71 and 72 as well as the converter layer 3 and the transparent protective layer 4, which are all covered by the housing 5 in a plan view, are dashed.

FIG. 2D shows the component 100 in sectional view. The semiconductor chip 10 has a vertical height C. The component 100 has a vertical height H composed in particular of the height C of the semiconductor chip 10 and the vertical layer thickness G1 of the housing 5 above the front side 11 of the semiconductor chip 10. In particular, the overall height H of the component 100 is given by the total vertical expansion of the housing 5. Preferably, the rear side 102 of the component 100 is formed in places by the rear side 12 of semiconductor chip 10. With my method the overall height H of the component 100 can exceed the overall height C of the semiconductor chip 10 by at most 50%, 30%, 20% or by at most 10% so that a particularly thin side-emitting component can be achieved.

According to FIG. 2D, exclusively on a side surface 103a at the front side forming a radiation exit surface, the component 100 has a transparent protective layer 4 in particular comprising singulation traces.

Deviating from this, it is possible for the component 100 to have a further transparent protective layer on a further side surface, for instance on a rear side surface 103b, wherein the further transparent protective layer may have singulation traces. For example, as shown in FIG. 1D, before singulation, the transparent protective layer 4 is formed sufficiently thick so that the transparent protective layer 4 can be singulated along its entire extension during singulation. In particular, the transparent protective layer 4 having a sufficiently large lateral layer thickness D is cut through such that adjacent components 100 each have one of the partial layers of the same original transparent protective layer 4. Such finished components 100 may have a transparent protective layer 4 having singulation traces on both the front side surface 103a and on a further side surface such as on the rear side surface 103b. The transparent protective layer 4 on the front side surface 103a is in particular contiguous and covers the converter layer 3 for instance completely. Due to the production process, the further transparent protective layer on the further side surface, for instance on the rear side surface 103b, may have subregions are spatially separated from each other. Such subregions can be the remnants of an original transparent protective layer 4.

Figure 3:
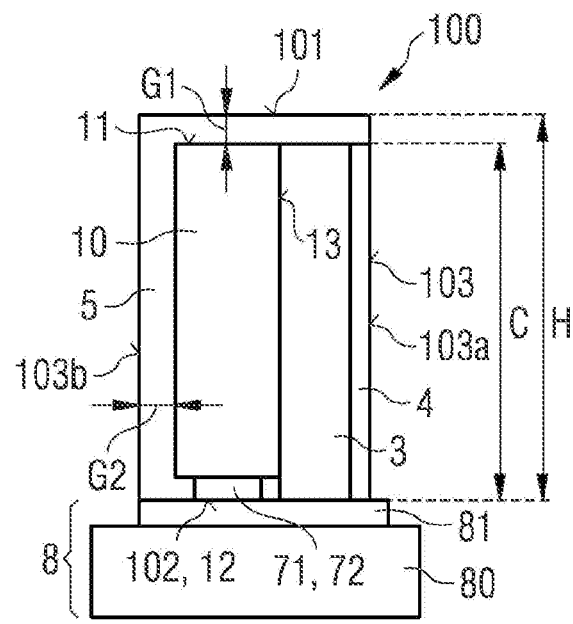
FIG. 3 shows an arrangement having a side-emitting component.

FIG. 3 shows an arrangement comprising a side-emitting component 100 on a printed circuit board 8. The example shown in FIG. 3 in particular corresponds to the example of a component shown in FIG. 2D. The printed circuit board 8 contains a basic body 80 and electrical conductor tracks 81 arranged therein. The printed circuit board 8 can have a plurality of electrical and/or thermal connection surfaces connected to the conductor tracks 8. It is possible that the thermal connection surfaces are separated from the electrical conductor tracks 81.

On the rear side 12 or 102, the component 100 can electrically connect to the conductor tracks 81 via the terminal pads 71 and 72. For example, the component 100 can be soldered to the circuit board 8. The component 100 is preferably arranged on the printed circuit board 8 such that the converter layer 3 thermally connects to the printed circuit board 8 directly or exclusively only via a single connecting layer. Since the converter layer 3 is arranged on the side of the semiconductor chip 10, a direct thermal dissipation of the converter layer 3 can take place directly via the printed circuit board 8, as a result of which the component 100 can be operated at higher current, for example, compared to side emitters in which thermal dissipation of the converter layer 3 predominantly or exclusively takes place over the semiconductor chip 10.

Figure 4A:
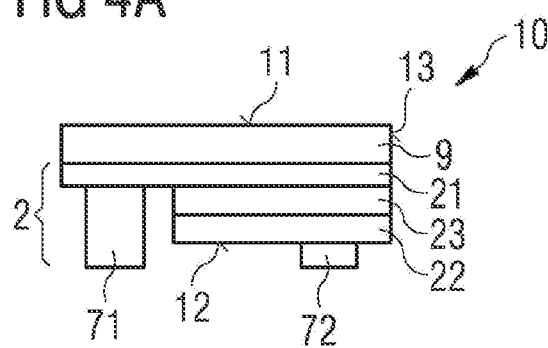
FIGS. 4A, 4B and 4C show various examples of a semiconductor chip of the side-emitting component.
Figure 4B:
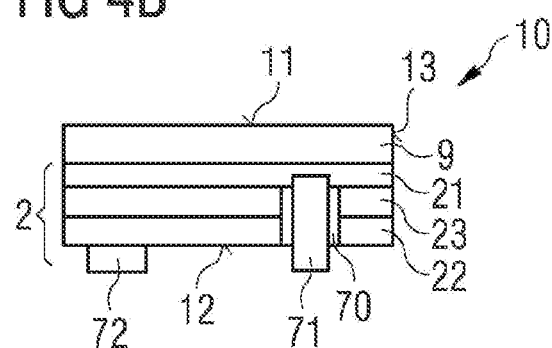
Figure 4C:
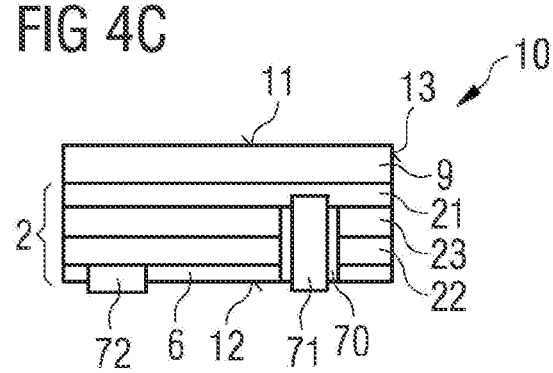

FIGS. 4A, 4B and 4C show various but not exhaustive examples of a semiconductor chip 10 for the side-emitting component 100. The semiconductor chip 10 can be an LED or a semiconductor laser. For example, the semiconductor chip 10 comprises a semiconductor body 2 having a plurality of semiconductor layers 21, 22 and 23, wherein the semiconductor body 2 are disposed on a substrate 9. In particular, the semiconductor chip 10 is formed as a volume emitter. The substrate 9 can be radiation-transmissive. The substrate 9 can be a growth substrate or different from a growth substrate. For example, it is possible that a growth substrate of the semiconductor chip 10 is removed from the semiconductor body 2 so that the semiconductor chip 10 is free of a growth substrate.

According to FIGS. 4A, 4B and 4C, the semiconductor chip 10 has a front side 11 and a rear side 12 facing away from the front side 11. The front side 11 can be formed by a surface of the substrate 9. The semiconductor chip 10 has terminal pads 71 and 72 on the rear side 12 to electrically contact the semiconductor chip 10. The terminal pads 71 and 72 can each be parts of connection layers or electrically conductively connect to connection layers adjoining the semiconductor body 2 (FIG. 4A) or extending for instance into the semiconductor body 2 (FIGS. 4B and 4C).

In particular, the semiconductor chip 10 contains a first terminal pad 71 electrically conductively connected to a first semiconductor layer 21 of the semiconductor body 2, and a second terminal pad 72 electrically conductively connected to a second semiconductor layer 22 of the semiconductor body 2. The semiconductor body 2 also has an active layer 23 located between the first semiconductor layer 21 and the second semiconductor layer 22, and configured for instance to emit electromagnetic radiation in the visible, ultraviolet or infrared spectral ranges during operation of the component 100. The active layer 23 has a main extension surface that, in particular, is parallel to the front side 11 and/or to the rear side 12 of the semiconductor chip. Thus, the main extension surface of the active layer 23 is directed transversely, in particular perpendicular to a side surface 13 of the semiconductor chip 10, wherein the side surface 13 can be provided with a transparent protective layer 4 or with a conversion platelet 30. Alternatively, it is also possible that the semiconductor chip 10 is formed such that the main extension surface of the active layer 23 runs parallel to the transparent protective layer 4 or to the conversion platelet 30.

In particular, the semiconductor chip 10 itself is an unhoused semiconductor chip free of a housing that surrounds the semiconductor body 2 for instance laterally. The semiconductor chip 10 can be a flip chip, wherein the second semiconductor layer 22 and the active layer 23 are partially removed to expose the first semiconductor layer 21, wherein at an exposed surface of the first semiconductor layer 21 electrically connects to the first terminal pad 71. FIG. 4A shows a flip chip that may have a sapphire substrate 9. Alternatively, the semiconductor chip 10 may have a terminal pad 71 formed as part of a connection layer in the form of a through-via, wherein the through-via extends throughout the second semiconductor layer 22 and the active layer 23 into the first semiconductor layer 21 and thus electrically connects to the first semiconductor layer 21 (FIGS. 4B and 4C). In contrast to a flip chip, in lateral directions, the through-via is completely enclosed by the second semiconductor layer 22 and the active layer 23 and is electrically isolated from these layers by an insulating layer 70.

The semiconductor chip 10 can have a mirror layer 6 (FIG. 4C) that, for example, is an integrated part of the semiconductor chip 10. The mirror layer 6 is located in particular within the semiconductor chip 10 or on the rear side 12 of the semiconductor chip 10. Preferably, the mirror layer 6 is configured such that it completely covers the semiconductor body 2 except for the terminal pads 71 and 72. Deviating from FIGS. 4A and 4B, the semiconductor chips 10 shown in these figures may also have a mirror layer 6 as shown in FIG. 4C.

This application claims priority of DE 10 2017 104 722.0, the subject matter of which is incorporated herein by reference.

My methods and components are not restricted to the examples by the description made with reference to examples. This disclosure rather comprises any novel feature and any combination of features, including in particular any combination of features in the appended claims, even if the feature or combination is not itself explicitly indicated in the claims or examples.

The invention claimed is:

1. A method of producing side-emitting components comprising:
providing a plurality of semiconductor chips on an auxiliary carrier, wherein the semiconductor chips on the auxiliary carrier are spaced apart from each other and each have a side surface provided with a transparent protective layer;
covering the semiconductor chips with a radiation-reflecting molding compound so that in a plan view of the auxiliary carrier, the semiconductor chips are completely covered by the molding compound; and
singulating the molding compound and the semiconductor chips into a plurality of components so that the components each comprise a semiconductor chip, wherein the components are singulated at the associated transparent protective layer, as a result of which the components each have a radiation exit surface exposed by the molding compound and formed by a surface of the remaining or exposed transparent protective layer,
wherein the method further comprises one of i. to v.:
i. the molding compound is singulated such that the components each have a radiation-reflecting housing made of the molding compound, and the housing laterally surrounds the associated semiconductor chip with the exception of the side surface comprising the remaining transparent protective layer;
ii. the semiconductor chips are each externally electrically connectable via their rear sides, and the rear sides of the semiconductor chips each adjoin the corresponding side surface comprising the transparent protective layer and run transversely or perpendicularly to the radiation exit surface of the associated component;
iii. the molding compound comprises a matrix material, radiation-reflecting particles that achieve high reflectivity and fillers that reduce the coefficient of thermal expansion, and the radiation-reflecting particles and the fillers are embedded in the matrix material;
iv. before being provided on the auxiliary carrier, the semiconductor chips are arranged on a carrier layer and each provided with a conversion platelet on the respective side surfaces, and the conversion platelet is at least two-layer and comprises a converter layer and the transparent protective layer; or
v. the transparent protective layer has a lateral layer thickness formed so thick that the transparent protective layer can be severed along its entire extent when the components are singulated so that, after singulation, the transparent protective layer is severed into two partial layers each having the original extent and a reduced lateral layer thickness.

2. The method according to claim 1, further comprising i.

3. The method according to claim 2, wherein the semiconductor chips are volume-emitting semiconductor chips that, after singulation, are each completely covered by the housing except for a rear side and the side surface covered by the transparent protective layer.

4. The method according to claim 1, further comprising ii.

5. The method according to claim 1, wherein, after singulation, the components are separated from the auxiliary carrier.

6. The method according to claim 1, wherein the semiconductor chips are covered by a mold process, and prior to singulation, the semiconductor chips are completely enclosed by the molding compound in lateral directions.

7. The method according to claim 1, further comprising iii.

8. The method according to claim 7, wherein the fillers are $SiO_2$-particles and the radiation-reflecting particles are $TiO_2$-particles, and the fillers and the radiation-reflecting particles account for 70% to 95% by weight of the molding compound.

9. The method according to claim 1, further comprising iv.

10. The method according to claim 1, further comprising v.

11. A side-emitting component producible according to the method of claim 1, comprising a semiconductor chip and a radiation-reflecting housing, wherein
the semiconductor chip is completely covered by the radiation-reflecting housing except for a side surface and a rear side,
the side surface is covered by a transparent protective layer, the surface of which forms a radiation exit surface of the component and shows singulating traces,
the component is electrically externally connectable via the rear side of the semiconductor chip, and
during operation of the component, electromagnetic radiation generated by the semiconductor chip can be decoupled from the component exclusively via the radiation exit surface.

12. The side-emitting component according to claim 11 having a vertical height of at most 200 microns.

13. The side-emitting component according to claim 11, wherein the semiconductor chip has a mirror layer on its rear side.

14. The side-emitting component according to claim 11, further comprising a converter layer between the side surface and the transparent protective layer, wherein the converter layer completely covers the side surface.

15. An arrangement comprising the side-emitting component according to claim 14, arranged on a printed circuit board, wherein the component is electrically connectable to the printed circuit board via the rear side of the semiconductor chip, and the converter layer thermally connects to the printed circuit board directly or exclusively via a single connecting layer.

16. A side-emitting component comprising a semiconductor chip and a radiation-reflecting housing, wherein
the semiconductor chip is completely covered by the radiation-reflecting housing except for a side surface and a rear side,
the side surface is covered by a transparent protective layer, the surface of which forms a radiation exit surface of the component and shows singulating traces,
the component is electrically externally connectable via the rear side of the semiconductor chip,
the component or the radiation-reflecting housing has a total vertical height that differs by at most 50% from a vertical height of the associated semiconductor chip, and
during operation of the component, electromagnetic radiation generated by the semiconductor chip can be decoupled from the component exclusively via the radiation exit surface.

17. The side-emitting component according to claim 16, wherein the semiconductor chip is provided with a conversion platelet on the side surface,
the conversion platelet is at least two-layer and comprises a converter layer and the transparent protective layer, and the converter layer is arranged between the transparent protective layer and the side surface.

18. A side-emitting component comprising a semiconductor chip and a radiation-reflecting housing, wherein the semiconductor chip is covered by the radiation-reflecting housing except for a side surface, wherein a rear side of the semiconductor chip is covered at least in places by a material of the housing, the side surface is covered by a transparent protective layer, the surface of which forms a radiation exit surface of the component and shows singulating traces, the component is electrically externally connectable via the rear side of the semiconductor chip, the component or the radiation-reflecting housing has a total vertical height that differs by at most 50% from a vertical height of the associated semiconductor chip, and during operation of the component, electromagnetic radiation generated by the semiconductor chip can be decoupled from the component exclusively via the radiation exit surface.

19. The side-emitting component according to claim 18, wherein the semiconductor chip is provided with a conversion platelet on the side surface, the conversion platelet is at least two-layer and comprises a converter layer and the transparent protective layer, and the converter layer is arranged between the transparent protective layer and the side surface.

* * * * *